United States Patent
Su et al.

(10) Patent No.: US 8,063,492 B2
(45) Date of Patent: Nov. 22, 2011

(54) MULTI-CHIP STACKED PACKAGE

(75) Inventors: Ting-Feng Su, Hsinchu (TW); Chien-Ming Chen, Hsinchu (TW)

(73) Assignee: Powertech Technology, Inc., Hsinchu (TW)

( * ) Notice: Subject to any disclaimer, the term of this patent is extended or adjusted under 35 U.S.C. 154(b) by 235 days.

(21) Appl. No.: 12/430,608

(22) Filed: Apr. 27, 2009

(65) Prior Publication Data

US 2010/0270688 A1 Oct. 28, 2010

(51) Int. Cl.
*H01L 29/40* (2006.01)

(52) U.S. Cl. .............................. 257/777; 257/E23.169

(58) Field of Classification Search .................. 257/777, 257/E23.169
See application file for complete search history.

(56) References Cited

U.S. PATENT DOCUMENTS 6,683,385 B2   1/2004  Tsai et al.
7,298,032 B2 * 11/2007  Kim et al. ..................... 257/686

FOREIGN PATENT DOCUMENTS

TW            I250597        3/2006
* cited by examiner

*Primary Examiner* — Zandra Smith
*Assistant Examiner* — Paul Patton
(74) *Attorney, Agent, or Firm* — Muncy, Geissler, Olds & Lowe, PLLC

(57) ABSTRACT

A multi-chip stacked package primarily comprises a chip carrier, a first chip disposed on the chip carrier, a plurality of die-attaching bars, a second chip stacked on the first chip by the adhesion of the die-attaching bars, and a plurality of bonding wires electrically connecting the first chip to the chip carrier. The die-attaching bars are formed on the first chip in a specific pattern and have an adhesive surface away from the first chip for adhering the second chip. The bonding wires have a loop height lower than the adhesive surface in a manner that specific sections of the bonding wires are embedded in the corresponding die-attaching bar from the adhesive surface. Accordingly, the die-attaching bars can modify and fasten the bonding wires in advance to avoid collapse and deformation of the bonding wires during stacking of the second chip and encapsulating processes.

11 Claims, 4 Drawing Sheets

MULTI-CHIP STACKED PACKAGE

FIELD OF THE INVENTION

The present invention relates to semiconductor devices, and more particularly to multi-chip stacked packages.

BACKGROUND OF THE INVENTION

In a conventional multi-chip stacked package, a plurality of semiconductor chips are vertically stacked on a chip carrier with the active surfaces of the chips facing upward. Bonding wires are implemented to electrically connect the chips to the chip carrier. Comparing to back-to-back stacking, this multi-chip stacked package has the advantages of stacking more chips with better uniform bonding wire lengths connecting to different chips. However, the length of bonding wires increases when stacking more chips, the risk of wire sweeping will also increase causing most common failure mode of electrical short in this multi-chip stacked package. Film-Over-Wire (FOW) technology can be implemented to resolve wire sweeping issues by pre-encapsulating the middle sections of the bonding wires between the chips during chip stacking process to ensure no wire sweeping during molding process.

As shown in FIG. 1, a conventional multi-chip stacked package is disclosed when stacking a second chip 130 on a first chip 120. The first chip 120 is disposed on the chip carrier 110 such as printed wiring boards or lead frames. The first chip 120 has a first active surface 121 and a plurality of first bonding pads 123 disposed on a central region of the first active surface 121. The first bonding pads 123 of the first chip 120 are electrically connected to the chip carrier 110 by a plurality of bonding wires 140. The second chip 150 is provided where the second chip 150 has the same dimension as the one of the first chip 120 and has a second active surface 151 and a plurality of second bonding pads 153 disposed on a central region of the second active surface 151. Before stacking the second chip 150 on top of the first active surface 121 of the first chip 120, a wafer-level die-attaching material 130 (FOW film) is pre-formed on the second back surface 152 of the second chip 150 to attach the second chip 150 to the first chip 120 where the wafer-level die-attaching material 130 is partially cured paste, i.e., B-stage paste, to partially encapsulate the bonding wires 140.

As shown in FIG. 2, the die-attaching material 130 is attached to the first active surface 121 of the first chip 120 by a pre-decided pressure and all of the bonding wires 140 are partially encapsulated during stacking of the second chip 150. However, the bonding wires 140 are collapsed and deformed under the die-bonding pressure from the die-attaching material 130 to directly contact with the first active surface 121 of the first chip 120 leading to poor packaging quality, more the worse, leading to electrical short between the adjacent bonding wires 140 and air gap between the chips 120 and 150 causing lower packaging yield. Therefore, even with the existing wire bonding technology, a wire capillary (wire-bonding tool) can move in various bonding directions and track with multiple bending angles to increase the horizontal sections of the bonding wires 140 suspended above the first chip 120 (as shown in FIG. 1), however, the collapse and deformation of the bonding wires 140 during attaching the second chip 150 can not be avoided. Furthermore, another method to improve collapse and deformation of bonding wires 140 during stacking process is to change the physical properties of the die-attaching material 130 to be softer and more fluid-like, however, the volatile materials in the die-attaching material 130 can not be exhausted leading to trapped bubbles in the die-attaching material 130. Moreover, uniformity of curing level of the die-attaching material 130 becomes an issue, i.e., curing level at the peripheries of the die-attaching material 130 is higher than the one at the center. Once the peripheries of the die-attaching material 130 is fully cured, then the volatile materials at the center of the die-attaching material 130 will be blocked and can not be exhausted. Even with the extended curing time, the center of the die-attaching material 130 still can not be fully cured leading to chip peeling issues due to uneven uniformity of curing level.

In Taiwan Patent No. 1250597, entitled "Method for manufacturing multi-chip package having encapsulated bond-wires between stack chips", Lin et al. disclose a method to avoid bonding wires from collapse and deformation from directly contacting with the active surface of the bottom chip. A patterned bottom die-attaching layer is pre-formed on the active surface of the bottom chip and a top die-attaching layer is pre-formed on the back surface of the top chip. Then the top chip is pressed downward to attach to the bottom chip so that portions of the bonding wires above the active surface of the bottom chip are encapsulated between the top and bottom die-attaching layers. However, the pattern of the top die-attaching layer is different from the one of the bottom die-attaching layer, therefore, the top die-attaching layer can not easily fill the central gap of the bottom die-attaching layer causing trapped bubbles leading to package reliability issues. Furthermore, since the top die-attaching layer has to be pre-formed on the back surface of the top chip, extra components and process are needed where the height of the stacked package is also increased which can not meet the light, slim, thin, and small requirements of electronic products with lower cost. Moreover, trapped bubbles in the die-attaching layer will become an issue.

In U.S. Pat. No. 6,683,385 B2, entitled "LOW PROFILE STACK SEMICONDUCTOR PACKAGE", Tsai et al. disclose another method to avoid bonding wires collapse and deformation from directly contact with the active surface of the bottom chip. An insulating cushion member is disposed at peripheral edges of the active surface of the bottom chip. When the bonding wires extend from the bonding pads of the bottom chip and turn downward to the substrate by overpassing the cushion member, the bonding wires are approximately horizontal and in contact with the cushion member to avoid directly contact with the peripheral edge. Then, a die-attaching layer is disposed on the bottom chip with the top chip stacked on top of the die-attaching layer of the bottom chip so that the electrical connection mechanism of the bottom chip will not be damaged nor affected. However, for the disclosed method, another cushion member is needed leading to more complicated process with higher cost where the cushion member located at the peripheries of the chip will also hinder the exhaust of the volatile materials inside the die-attaching layer.

SUMMARY OF THE INVENTION

The main purpose of the present invention is to provide a multi-chip stacked package to effectively secure the bonding wires electrically connecting the stacked chips under limited component numbers and package thickness and to avoid bonding wires collapse and deformation as the conventional stacked package without trapped bubbles inside the die-attaching components.

The second purpose of the present invention is to provide a multi-chip stacked package to modify the loop heights of the bonding wires extending between stacked chips and to fasten the bonding wires in advance to increase the horizontal length without increasing the total package thickness to achieve lower cost with simplified processes.

According to the present invention, a multi-chip stacked package is revealed, primarily comprising a chip carrier, a first chip, a plurality of die-attaching bars, a plurality of first bonding wires, and a second chip. The first chip is disposed on the chip carrier where the first chip has a first active surface and a plurality of first bonding pads disposed on a central region of the first active surface. The first die-attaching bars are formed on the first active surface in a pattern to dispose at two opposing sides adjacent to the first bonding pads and also to form a central gap between the first die-attaching bars without covering the first bonding pads. Moreover, the first die-attaching bars have an adhesive surface away from the first active surface for adhering the second chip. The first bonding pads of the first chip are electrically connected to the chip carrier by the first bonding wires where the first bonding wires have a loop height lower than the adhesive surface in a manner that specific sections of the first bonding wires are embedded in the corresponding first die-attaching bar from the adhesive surface. The second chip has a second active surface and a second back surface where the back surface is attached to the adhesive surface of the first die-attaching bars.

The multi-chip stacked package according to the present invention has the following advantages and functions:

1. Through the assembly of the plurality of patterned die-attaching bars disposed between chips with the bonding wires partially embedded in die-attaching bars as a technical means, the uniformity of the viscosity and the curing level of the die-attaching bars can be kept and the bonding wires electrically connecting the stacked chips are effectively secured under limited component numbers and package thickness and to avoid bonding wires from collapse and deformation as the conventional stacked package without trapped bubbles inside the die-attaching layers.
2. Through the assembly of the plurality of patterned die-attaching bars disposed between chips with the bonding wires partially embedded in die-attaching bars as a technical means, the loop heights of the bonding wires extending between stacked chips can be modified to increase the horizontal length without increasing the total package thickness to achieve lower cost with simplified processes.
3. Through the assembly of the plurality of patterned die-attaching bars disposed between chips and the encapsulant completely filling in the central gap formed by die-attaching bars as a technical means, the reliability of semiconductor packages can greatly be enhanced by increasing the encapsulation of the chip and by reducing the trapped bubbles between the chips.
4. Through specific embedded sections of the bonding wires from the adhesive surface of the die-attaching bars away from the bottom chip as a technical means, the bonding wires will not be affected by the mold flow of the encapsulant causing shifting or sweeping so that electrical short between the adjacent bonding wires or between the bonding wires and the chips can be avoided.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, or with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
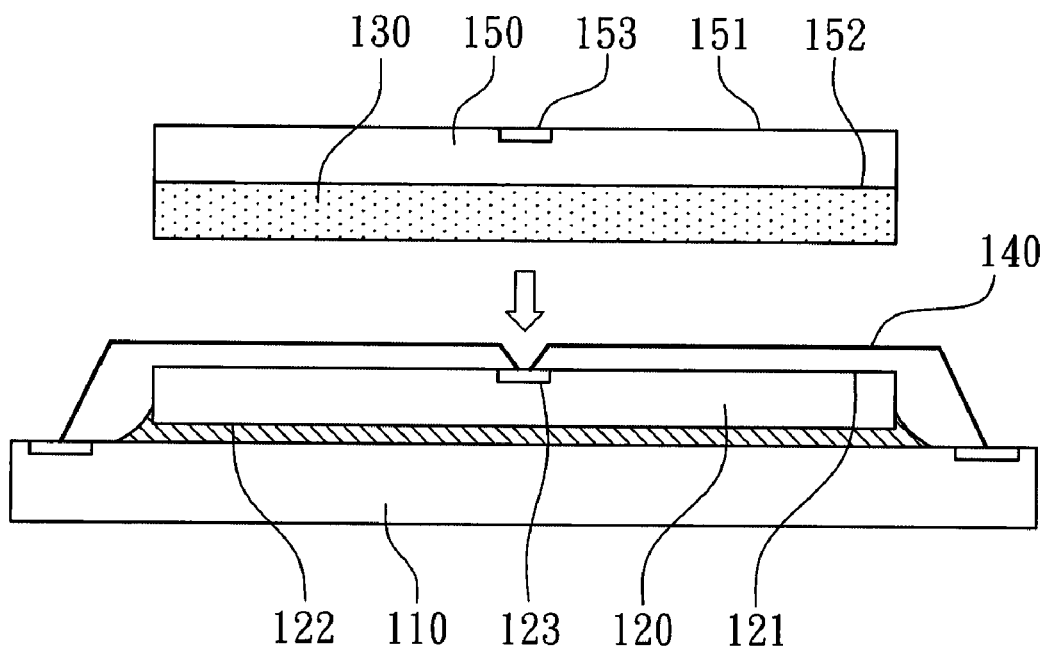
FIG. 1 is a cross-sectional view of a conventional stacked package during disposing a second chip on top of a wire-bonded first chip.
Figure 2:
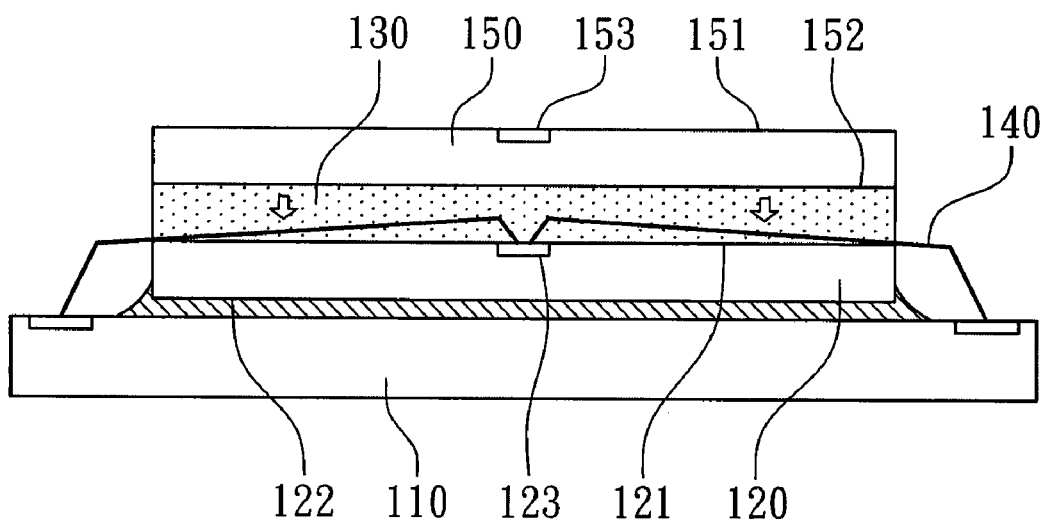
FIG. 2 is a cross-sectional view of a conventional stacked package after disposing the second chip.
Figure 3:
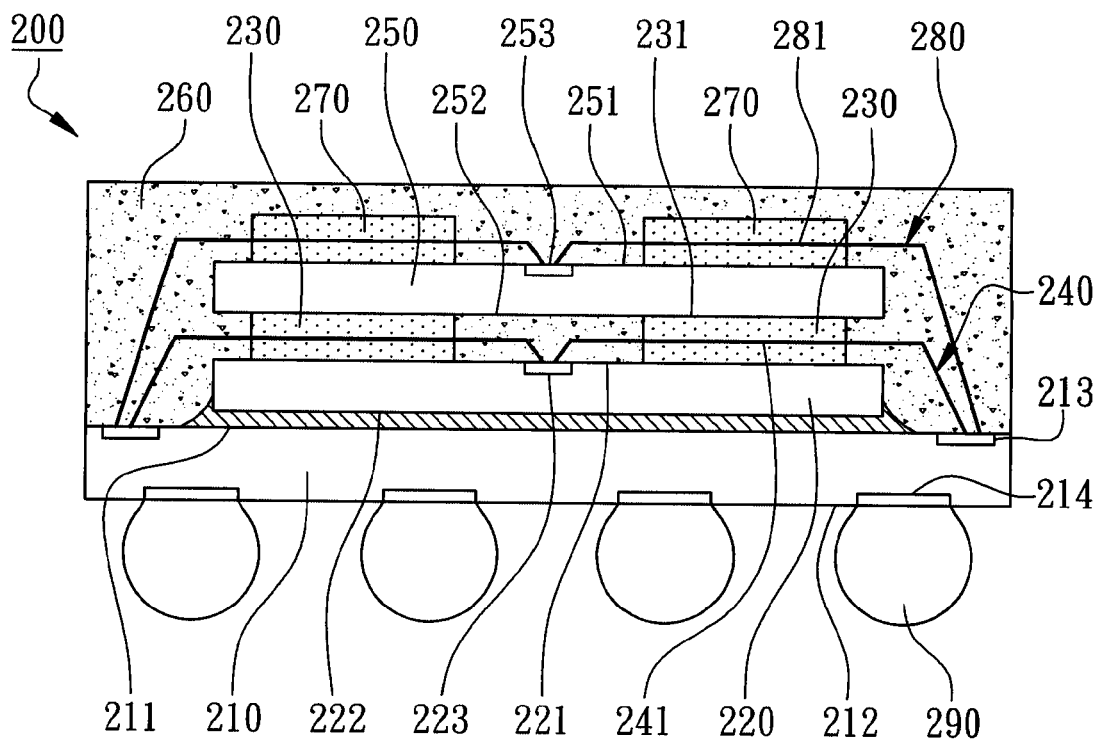
FIG. 3 is the cross-sectional view of a multi-chip stacked package according to the preferable embodiment of the present invention.

According to the first embodiment of the present invention, a multi-chip stacked package is illustrated in FIG. 3 for the cross-sectional view. The multi-chip stacked package 200 primarily comprises a chip carrier 210, a first chip 220, a plurality of first die-attaching bars 230, a plurality of first bonding wires 240, and a second chip 250.

The chip carrier 210 has a top surface 211 and a bottom surface 212 where the chip carrier 210 can be a printed wiring board, a leadframe, a circuit film. In addition to carrying the chips, the chip carrier 210 is an electrically transmitting medium for the chips 220 and 250 and can be a high-density multi-layer printed wiring board with internal circuits and/or plated through holes. The top surface 211 is used for stacking chips and the bottom surface 212 is used for external connections. To be more specific, the chip carrier 210 has a plurality of internal pads 213 formed on the top surface 211 and a plurality of external pads 214 formed on the bottom surface 212 where the external pads 214 are arranged in multiple rows or in an array for placement of a plurality of solder balls 290 or the other external electrical terminals.

The first chip 220 is disposed on the top surface 211 of the chip carrier 210 where the first chip 220 has a first active surface 221, a first back surface 222 and a plurality of first bonding pads 223 disposed on the first active surface 221 where the ICs in the first chip 220 such as memory components (not shown in the figure) are formed on the first active surface 221 and the first bonding pads 223 are chip electrodes for connecting the ICs. The first bonding pads 223 are central pads arranged in one single row or multiple rows on a central region of the first active surface 221. In the present embodiment, the first bonding pads 223 are arranged in a single row where the first bonding pads 223 are made of aluminum or copper. The first back surface 222 of the first chip 220 is attached to the top surface 221 of the chip carrier 210 by double-sided PI tapes, liquid epoxy, preform, B-stage adhesives, or die-attaching materials (DAM).

The first die-attaching bars 230 are formed on the first active surface 221 of the first chip 220. The first die-attaching bars 230 are formed in a pattern to dispose at two opposing sides adjacent to the first bonding pads 223 as two separated strips in parallel and also to form a central gap between the first die-attaching bars 230 without covering the first bonding pads 223 (as shown in FIG. 4C). The first die-attaching bars 230 are polymer adhesives which can be liquid, paste, or solid when formed on the first chip 220 without fully cure. For example, the first die-attaching bars 230 are in B-stage or in partial cure states when forming the first bonding wires 240 and stacking the second chip 250 where B-stage adhesives are resin before complete curing which are solid or colloidal at room temperature and become fluid after raising temperature and turn into solid or jell after returning to room temperature which is reversible. Therefore, the first die-attaching bars 230 have an adhesive surface 231 away from the first chip 220 to achieve partially embedding of the first bonding wires 240 during wire-bonding processes (as shown in FIGS. 4D and 4E) and adhering a stacked chip such as the second chip 250 during chip stacking processes (as shown in FIG. 4F). In addition to chip-bonding adhesives, the first die-attaching bars 230 also functions as spacers between the stacked chips to offer a specific gap without extra spacing components as well as pre-fasteners and wire-loop modifiers by partially encapsulating the first bonding wires 240 from the adhesive surface 231 under appropriate temperature control and partial curing conditions.

As shown in FIG. 3, the central gap between two first die-attaching bars 230 without covering the first bonding pads 223 can provide wire-bonding connections of the first bonding wires 240, exhausting passage of volatile materials in the first die-attaching bars 230 especially at the center gaps of the stacked chips, and moldflow channel of the central chip-stacked gap by the encapsulant 260. Therefore, the central gap can provide many special functions to enhance the reliability of the multi-chip stacked package 200. The adhesive surface 231 of the first die-attaching bars 230 away from the first active surface 221 is used for stacking and adhering the second chip 250.

The first bonding pads 223 of the first chip 220 are electrically connected to the internal pads 213 of the chip carrier 210 by the first bonding wires 240. Moreover, the first bonding wires 240 have a loop height lower than the adhesive surface 231 in a manner that specific sections 241 of the first bonding wires 240 are embedded in the corresponding first die-attaching bar 230 from the adhesive surface 231 (as shown in FIGS. 4D and 4E). To be more specific, the thickness of the first die-attaching bars 230 is greater than the one of the maximum loop height of the first bonding wires 240 ranging from 2 mils to 10 mils to provide higher adhesive surface 231. The lengths of the specific sections 241 of the first bonding wires 240 do not exceed half of the length of the corresponding parallel side of the first active surface 221, therefore, the wire bonding points of the first bonding wires 240 will not be covered by the first die-attaching bars 230. Preferably, the embedded sections 241 of the first bonding wires 240 are modified in shapes by the first die-attaching bars 230 without direct contact with the first active surface 221 and the second back surface 252. The loop shapes of the first boding wires 240 embedded in the first die-attaching bars 230 become smoother and straighter by forming the first bonding wires 240 in top-to-down movements of the capillary. More preferably, the specific sections 241 are almost parallel to the first active surface 221 of the first chip 220 to reduce the thickness of the first die-attaching bars 230.

As shown in FIG. 3 again, the second chip 250 has a second active surface 251, a second back surface 252 and a plurality of second bonding pads 253 disposed on a central region of the second active surface 25 where the second back surface 252 is attached to and adhered by the adhesive surface 231 of the first die-attaching bars 230 to achieve chip stacking. Therefore, the second chip 250 is stacked above the first chip 220 by the first die-attaching bars 230 with the second active surface 251 facing upward. In this embodiment, the second chip 250 and the first chip 220 can be identical chips such as memory chips with the same dimension and with the same memory capacity. The second chip 250 and the first chip 220 are stacked in edge-to-edge alignment without any extruded nor concaved portions that are not overlapped.

As shown in FIG. 3, in the present embodiment, the multi-chip stacked package 200 further comprises a plurality of second die-attaching bars 270 formed on the second active surface 251 of the second chip 250 in a pattern to dispose at two opposing sides adjacent to the second bonding pads 253 and also to form a central gap between the second die-attaching bars 270 without covering the second bonding pads 253. The materials of the second die-attaching bars 270 can be the same as the first die-attaching bars 230 with the disposed locations vertically corresponding to the first die-attaching bars 230. Furthermore, the multi-chip stacked package 200 further comprises a plurality of second bonding wires 280 electrically connecting the second bonding pads 253 of the second chip 250 to the internal pads 213 of the chip carrier 210. The second bonding wires 280 have a loop height lower than the adhesive top surface of the second die-attaching bars 270 in a manner that specific sections 281 of the second bonding wires 280 is embedded in the corresponding second die-attaching bars 270 where the embedded mechanism of the second bonding wires 280 in the second die-attaching bars 270 can be the same as the one of the first bonding wires 240 in the first die-attaching bars 230. Moreover, without limitations, more chips can be stacked on top of the second chip 250.

For more detail descriptions, as shown in FIG. 3 again, the multi-chip stacked package 200 further comprises an encapsulant 260 formed on the chip carrier 210. The encapsulant 260 encapsulates the first chip 220 and the second chip 250 and also completely filled in the central gap between the first die-attaching bars 230 to completely encapsulate the first die-attaching bars 230. The central gap has a certain width to function as a mold flow channel for the formation of the encapsulant 260. Through the central gap formed by the first die-attaching bars 230 to increase the encapsulated area of the second chip 250 by the encapsulant 260 and to reduce the trapped bubbles between the first chip 220 and the second chip 250 to enhance the reliability of multi-chip stacked packages 200. Furthermore, since the specific sections 241 of the first bonding wires 240 are embedded in the corresponding first die-attaching bar 230 during molding process, therefore, wire sweeping issues of the first bonding wires 240 caused by the mold flow impact of the encapsulant 260 leading to electrical short between the adjacent first bonding wires 240 can be avoided. In more detail, the encapsulant 260 further completely encapsulates the first bonding wires 240 except the embedded sections 241.

From the above descriptions, a specific assembly according to the present invention provides a central gap formed by a plurality of patterned first die-attaching bars 230 disposed between the chips 220 and 250 and the embedding of the first bonding wires 240 in the first die-attaching bars 230, the uniformity of the viscosity and the curing level of the first die-attaching bars 230 can be kept and the bonding wires electrically connecting the stacked chips are effectively secured under limited component numbers and package thickness and to avoid bonding wires collapsing and deforming as the conventional stacked package without trapped bubbles inside the die-attaching layers.

As shown from FIG. 4A to FIG. 4F for cross-sectional views, the manufacturing method of the multi-chip stacked package 200 is further described in detail to further illustrate that the loop height of the bonding wires disposed between stacked chips can be modified to increase the horizontal length without increasing total package height and to achieve lower cost and simplify the process.

Figure 4A:
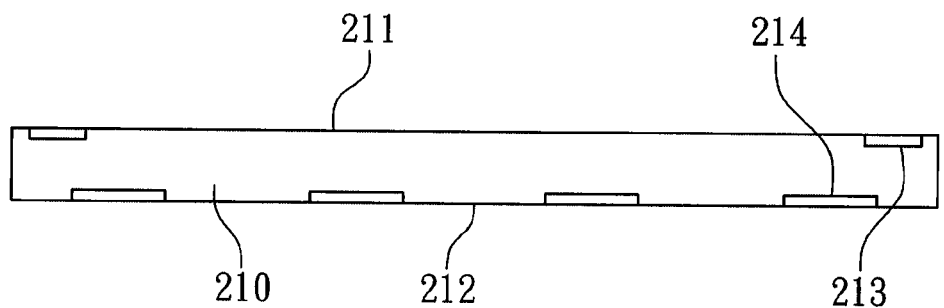
FIGS. 4A to 4F are the cross-sectional views of the components of a multi-chip stacked package during manufacturing process according to the preferable embodiment of the present invention.

Firstly, as shown in FIG. 4A, the chip carrier 210 is provided where a plurality of internal pads 213 are disposed on the top surface 211 of the chip carrier 210 and a plurality of external pads 214 are disposed on the bottom surface 212 of the chip carrier 210.

Figure 4B:
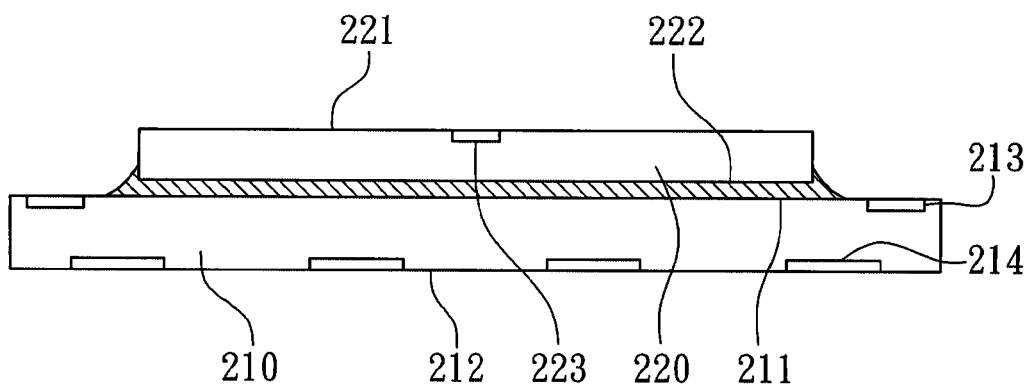
Figure 4C:
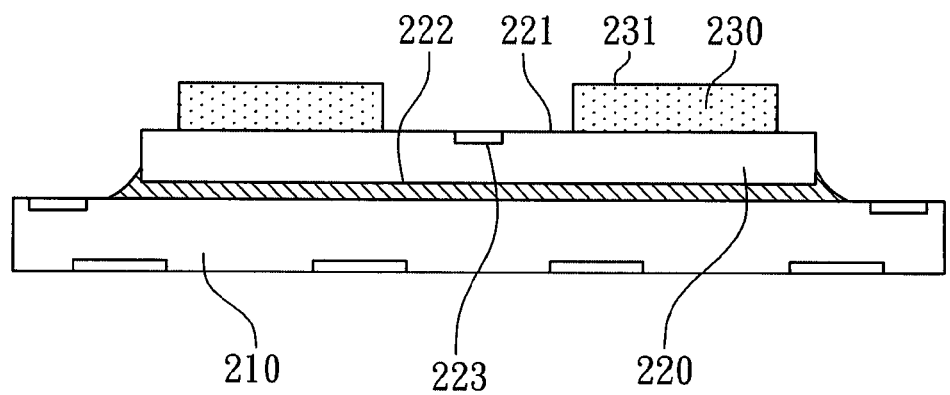
Figure 4D:
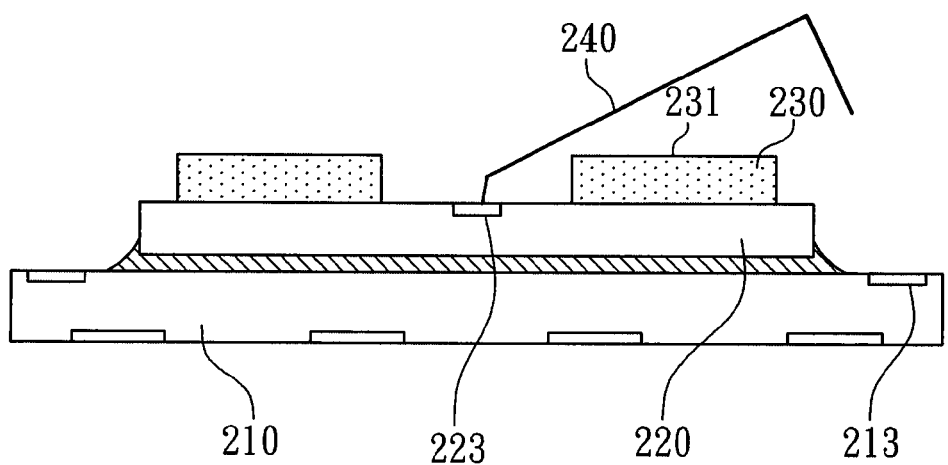
Figure 4E:
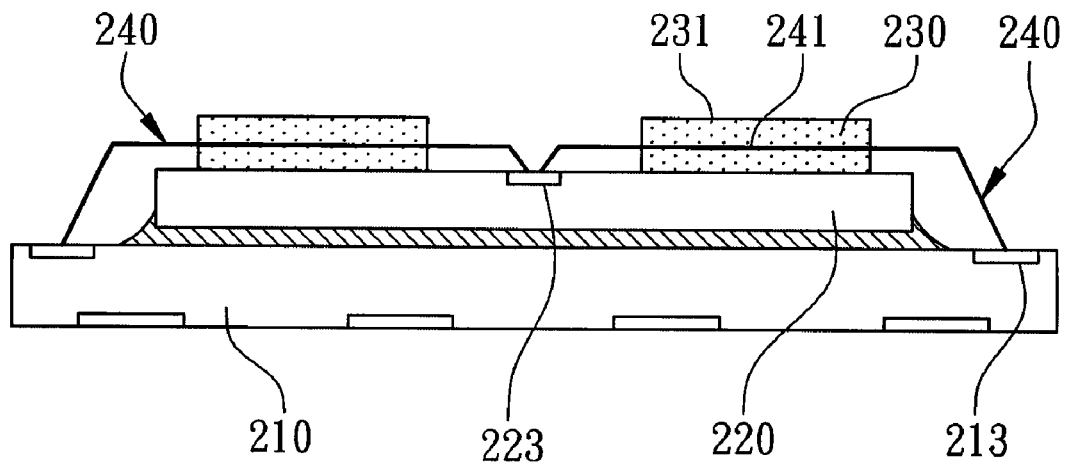
Figure 4F:
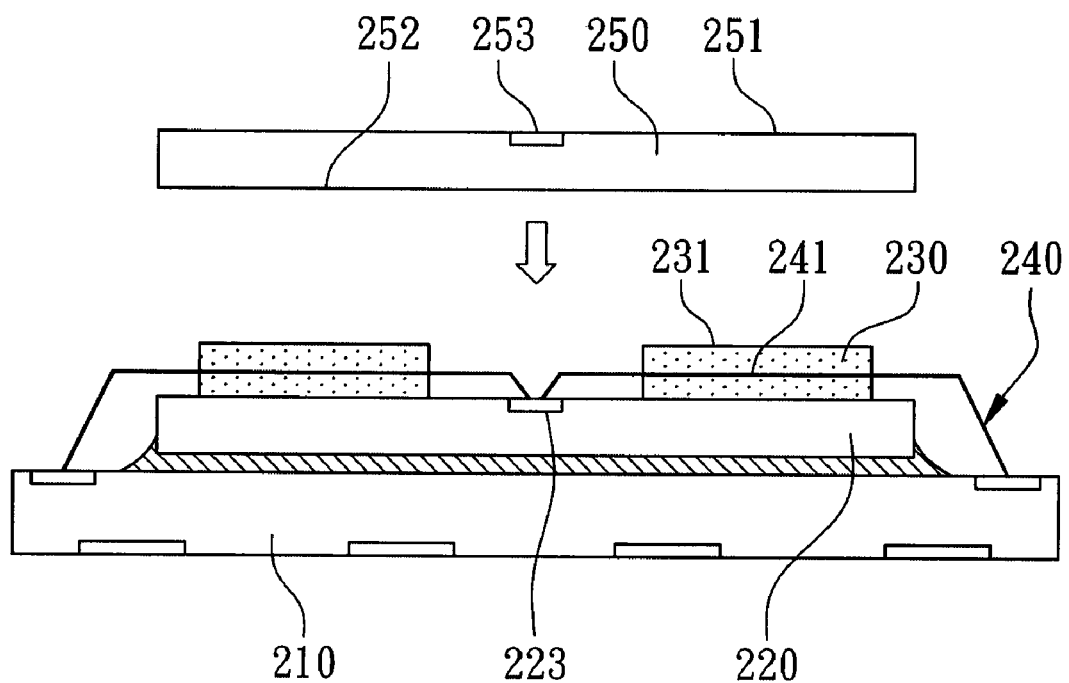

Then, as shown in FIG. 4B, the first chip 220 is disposed on the top surface 211 of the chip carrier 210 with the first active surface 221 of the first chip 220 facing upward to be away from the chip carrier 210. The first bonding pads 223 are disposed on a central region of the first active surface 221 of the first chip 220.

Then, as shown in FIG. 4C, a plurality of first die-attaching bars 230 are formed on the first active surface 221 of the first chip 220 by printing or by taping. The first die-attaching bars 230 are disposed at two opposing sides adjacent to the first bonding pads 223 and a central gap is formed between two first die-attaching bars 230 without covering the first bonding pads 223. Moreover, the first die-attaching bars 230 have an adhesive surface 231 away from the first active surface 221. After this step, the first die-attaching bars 230 can not be fully cured to keep the adhesive property of the adhesive surface 231 under high temperature.

Then, as shown in FIG. 4D, the first bonding wires 240 are formed by wire bonding to electrically connect the first bonding pads 223 of the first chip 220 to the internal pads 213 of the chip carrier 210. Normally, the material of the first bonding wires 240 is gold with excellent ductility. The wire bonding points of the first bonding wires 240 are formed by ultrasonic bonding, thermal compression bonding, or thermosonic bonding, etc.

As shown in FIGS. 4D and 4E, the wire loops of the first bonding wires 240 can be primarily formed by implementation of various bonding directions with multiple bending angles and modified by the first die-attaching bars 230. Moreover, the bonding wires are in high temperature during the wire bonding process, the specific sections 241 of the first bonding wires 240 can easily be embedded in the corresponding first die-attaching bar 230 from top to bottom through the adhesive surface 231. Since the specific sections 241 of the first bonding wires 240 are lower than the adhesive surface 231, so that the specific sections 241 of the first bonding wires 240 do not directly contact with the second chip 250 and will not affect the adhesion strength of the first die-attaching bars 230 to the second chip 250. Moreover, the first bonding wires 240 are formed individually where the individually heated first bonding wire 240 can more easily be embedded in the corresponding first die-attaching bar 230 then to the corresponding internal pads 213 with the existing viscosity of the first die-attaching bars 230 to adjust the loop height of the first bonding wires 240 disposed between stacked chips to increase the horizontal length without increasing total package height and to achieve lower cost and simplify the process.

After this step, the first die-attaching bars 230 can not be fully cured to keep the adhesive property of the adhesive surface 231 under high temperature. However, some degrees of baking of the first die-attaching bars 230 is recommended to control the gap between the stacked chips during chips stacking, i.e., the central gap should not be completely filled by the first die-attaching bars 230.

Then, in FIG. 4F, the second chip 250 is disposed on top of the first die-attaching bars 230 with the second back surface 252 attached to the adhesive surface 231 of the first die-attaching bars 230 without direct contacting with the first bonding wires 240. After this step, the first die-attaching bars 230 can be baked to be fully cured to effectively secure the first bonding wires 240 without impacting by the mold flow. The volatile materials in the first die-attaching bars 230 can be exhausted from the central gap during complete curing the first die-attaching bars 230 where hot air can flow into the central gap to uniformly bake the first die-attaching bars 230 to effectively reduce the complete curing time.

Therefore, relative to conventional chip stacked packages, according to the present invention the issues of collapse and deformation of the first bonding wires 240 can be resolved to avoid in contact with the active surface 221 of the bottom chip 220 during stacking process of the top chip 250 since the first bonding wires 240 are fastened in advance by embedded in the first die-attaching bars 230 from the adhesive surface 231 during wire-bonding processes. The extra cushion members or supporting layers can be eliminated without increasing the total package height to achieve lower cost and simplify the process, where the uniformity of the viscosity and the curing level of the die-attaching bars 230 between the stacked chips can be controlled to avoid trapped bubbles inside the die-attaching layers 230 as the conventional stacked packages.

The above descriptions of the embodiments of this invention are intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A multi-chip stacked package primarily comprising:
    a chip carrier;
    a first chip disposed on the chip carrier, wherein the first chip has a first active surface and a plurality of first bonding pads disposed on a central region of the first active surface;
    a plurality of first die-attaching bars formed on the first active surface of the first chip in a pattern to dispose at two opposing sides adjacent to the first bonding pads and also to form a central gap between the first die-attaching bars without covering the first bonding pads, wherein the first die-attaching bars have an adhesive surface away from the first active surface, the adhesive surface having a width not less than the width of the central gap between the first die-attaching bars;
    a plurality of first bonding wires electrically connecting the first bonding pads of the first chip to the chip carrier, wherein the first bonding wires have a loop height lower than the adhesive surface in a manner that specific sections of the first bonding wires are embedded in the corresponding first die-attaching bar from the adhesive surface;
    a second chip having a second active surface and a second back surface, wherein the second back surface is attached to the adhesive surface of the first die-attaching bars; and
    an encapsulant formed on the chip carrier to encapsulate the first chip and the second chip and also to completely fill in the central gap between the first die-attaching bars.

2. The multi-chip stacked package as claimed in claim 1, wherein the embedded sections of the first boding wires are modified in shapes by the first die-attaching bars without direct contact with the first active surface and the second back surface.

3. The multi-chip stacked package as claimed in claim 1, wherein the lengths of the embedded sections of the first bonding wires do not exceed half of the length of the corresponding parallel side of the first active surface.

4. The multi-chip stacked package as claimed in claim 1, wherein the encapsulant further completely encapsulates the first bonding wires except the embedded sections.

5. The multi-chip stacked package as claimed in claim 1, wherein the second chip further has a plurality of second bonding pads disposed on a central region of the second active surface.

6. The multi-chip stacked package as claimed in claim 5, wherein the first chip and the second chip are identical chips.

7. The multi-chip stacked package as claimed in claim 5, further comprising a plurality of second die-attaching bars formed on the second active surface of the second chip in a pattern to dispose at two opposing sides adjacent to the second bonding pads.

8. The multi-chip stacked package as claimed in claim 7, further comprising a plurality of second bonding wires electrically connecting the second bonding pads of the second chip to the chip carrier, wherein specific sections of the second bonding wires is embedded in the corresponding second die-attaching bar.

9. The multi-chip stacked package as claimed in claim 1, further comprising a plurality of external electrical terminals disposed on a bottom surface of the chip carrier.

10. The multi-chip stacked package as claimed in claim 9, wherein the external electrical terminals includes a plurality of solder balls.

11. The multi-chip stacked package as claimed in claim 9, wherein the chip carrier is a printed wiring board.

* * * * *